(12) United States Patent
Park et al.

(10) Patent No.: US 11,227,980 B2
(45) Date of Patent: Jan. 18, 2022

(54) DISPLAY DEVICE

(71) Applicant: Samsung Display Co., Ltd., Yongin-si (KR)

(72) Inventors: Jae Hong Park, Yongin-si (KR); Sung Woon Kim, Yongin-si (KR); Min Ki Nam, Yongin-si (KR); Kyoung Won Park, Yongin-si (KR); Dong Han Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 5 days.

(21) Appl. No.: 16/542,999

(22) Filed: Aug. 16, 2019

(65) Prior Publication Data

US 2020/0075814 A1    Mar. 5, 2020

(30) Foreign Application Priority Data

Aug. 29, 2018 (KR) .......... 10-2018-0102240

(51) Int. Cl.
| | |
|---|---|
| *H01L 33/50* | (2010.01) |
| *H01L 27/15* | (2006.01) |
| *H01L 33/62* | (2010.01) |
| *C09K 11/06* | (2006.01) |
| *H01L 33/24* | (2010.01) |

(Continued)

(52) U.S. Cl.
CPC ............ *H01L 33/502* (2013.01); *C09K 11/06* (2013.01); *H01L 27/156* (2013.01); *H01L 33/62* (2013.01); *C09K 2211/10* (2013.01); *H01L 27/1214* (2013.01); *H01L 33/06* (2013.01); *H01L 33/24* (2013.01); *H01L 33/325* (2013.01); *H01L 33/44* (2013.01)

(58) Field of Classification Search
CPC ..................................... H01L 33/502
See application file for complete search history.

(56) References Cited

U.S. PATENT DOCUMENTS

| | | | |
|---|---|---|---|
| 9,722,145 | B2 | 8/2017 | Sasaki et al. |
| 9,825,202 | B2 | 11/2017 | Schuele et al. |

(Continued)

FOREIGN PATENT DOCUMENTS

| | | |
|---|---|---|
| CN | 106910836 A | 6/2017 |
| KR | 10-2010-0089606 A | 8/2010 |

(Continued)

OTHER PUBLICATIONS

Machine translation of Im (KR20180021612) (Year: 2018).*

*Primary Examiner* — Christopher A Johnson
(74) *Attorney, Agent, or Firm* — Lewis Roca Rothgerber Christie LLP

(57) ABSTRACT

A display device includes: a substrate; a plurality of pixels on the substrate, and each of the pixels including first to third sub-pixels each including at least one light emitting diode configured to emit light; and a color conversion layer including first to third color conversion patterns respectively corresponding to the first to third sub-pixels, each of the first to third color conversion patterns configured to transmit the light or convert the light into light of a different color. The light emitting diode of each of the first to third sub-pixels is coupled to a first electrode and a second electrode. At least one of the first to third color conversion patterns includes a perovskite compound.

14 Claims, 5 Drawing Sheets

(51) Int. Cl.
   *H01L 33/32*   (2010.01)
   *H01L 33/06*   (2010.01)
   *H01L 33/44*   (2010.01)
   *H01L 27/12*   (2006.01)

(56) References Cited

U.S. PATENT DOCUMENTS

| | | |
|---|---|---|
| 2017/0133558 A1 | 5/2017 | Sasaki et al. |
| 2017/0133564 A1 | 5/2017 | Ulmer et al. |
| 2017/0139276 A1* | 5/2017 | Ulmer ............... G02F 1/133621 |
| 2017/0140961 A1 | 5/2017 | Sasaki et al. |
| 2017/0155020 A1 | 6/2017 | Lin et al. |
| 2017/0179092 A1 | 6/2017 | Sasaki et al. |
| 2017/0369776 A1 | 12/2017 | Luchinger et al. |
| 2018/0012873 A1 | 1/2018 | Lee et al. |
| 2018/0029038 A1 | 2/2018 | Sasaki et al. |
| 2018/0047867 A1 | 2/2018 | Schuele et al. |
| 2018/0301513 A1 | 10/2018 | Li |
| 2019/0018287 A1* | 1/2019 | Luchinger ............ C09K 11/665 |
| 2019/0041701 A1* | 2/2019 | Chen .................. H01L 25/0753 |

FOREIGN PATENT DOCUMENTS

| | | | |
|---|---|---|---|
| KR | 20180021612 | * 8/2016 | ............... A61B 6/00 |
| KR | 10-1782889 B1 | 9/2017 | |

\* cited by examiner

DISPLAY DEVICE

CROSS-REFERENCE TO RELATED APPLICATION

The present application claims priority to and the benefit of Korean patent application number 10-2018-0102240 filed on Aug. 29, 2018, the entire content of which is incorporated herein by reference.

BACKGROUND

1. Field

Various embodiments of the present disclosure relate to a display device.

2. Description of the Related Art

Light emitting diodes (LEDs) may have relatively suitable or satisfactory durability even under poor environmental conditions, and have excellent performance in terms of lifetime and luminance. Recently, research on applying such LEDs to various display devices has become noticeably more active.

As a part of such research, technologies of fabricating an LED having a small size corresponding to the micro-scale or the nano-scale using an inorganic crystalline structure, e.g., a structure obtained by growing a nitride-based semiconductor are being developed. For example, LEDs may be fabricated in a small size enough to form a pixel of a self-luminance display device, etc.

SUMMARY

Various embodiments of the present disclosure are directed to a display device having an improved color gamut.

An embodiment of the present disclosure may provide a display device including: a substrate; a plurality of pixels on the substrate, each of the pixels including first to third sub-pixels each including at least one light emitting diode configured to emit light; and a color conversion layer including first to third color conversion patterns respectively corresponding to the first to third sub-pixels, each of the first to third color conversion patterns being configured to transmit the light or convert the light into light of a different color. The light emitting diode of each of the first to third sub-pixels may be coupled to a first electrode and a second electrode. At least one of the first to third color conversion patterns may include a perovskite compound.

In an embodiment, two of the first to third color conversion patterns each may include a perovskite compound.

In an embodiment, the color conversion patterns each including the perovskite compound are the first and second color conversion patterns, and the first color conversion pattern may be configured to convert the light into red light, the second color conversion pattern may be configured to convert the light into green light, and the third color conversion pattern may be configured to transmit the light.

In an embodiment, at least one of the first and second color conversion patterns may further include a quantum dot.

In an embodiment, the light emitting diode may be configured to emit blue light.

In an embodiment, one of the first to third color conversion patterns may include a perovskite compound, and another one of the first to third color conversion patterns may include a quantum dot.

In an embodiment, the first color conversion pattern may include a quantum dot configured to convert the light into red light, and the second color conversion pattern may include a perovskite compound configured to convert the light into green light.

In an embodiment, the second color conversion pattern may further include a quantum dot.

In an embodiment, the light emitting diode may be configured to emit blue light.

In an embodiment, the perovskite compound may be represented by formula 1 below:

$$AMX_3 \qquad \text{Formula 1}$$

wherein A may be a monovalent organic cation or a monovalent transition metal or alkali metal cation, M may be a divalent transition metal, rare earth metal, alkaline earth metal, Pb, Sn, Ge, Ga, In, Al, Sb, Bi or Po cation, X may be selected from the group consisting of halogen anions and combinations thereof, and two or more of X may be identical or different.

In an embodiment, the perovskite compound may be represented by formula 2 below:

$$A_3M_2X_9 \qquad \text{Formula 2}$$

wherein A may be selected from the group consisting of monovalent organic cations, monovalent transition metal and alkali metal cations, and combinations thereof, M may be selected from the group consisting of trivalent cations and combinations thereof, X may be selected from the group consisting of halogen anions and combinations thereof, and two or more of A, M or X may be identical or different.

In an embodiment, the perovskite compound may be represented by formula 3 below:

$$A_2MM'X_6 \qquad \text{Formula 3}$$

wherein A may be selected from the group consisting of monovalent organic cations, monovalent transition metal and alkali metal cations, and combinations thereof, M may be a monovalent transition metal, alkali metal or In cation, M' may be a trivalent cation, X may be selected from the group consisting of halogen anions and combinations thereof, and two or more of A, M or X may be identical or different.

In an embodiment, the perovskite compound is represented by formula 4 below:

$$A_2MX_4 \qquad \text{Formula 4}$$

wherein A may be selected from the group consisting of monovalent organic cations, monovalent transition metal and alkali metal cations, and combinations thereof, M may be a divalent cation of a transition metal or other suitable metal, X may be selected from the group consisting of halogen anions and combinations thereof, and two or more of A or X may be identical or different.

In an embodiment, the perovskite compound may have a form selected from the group consisting of a quantum dot, a nanocrystal, a nanoplate, a nanosheet, and combinations thereof.

In an embodiment, a composite includes the perovskite compound and a polymer.

In an embodiment, the color conversion pattern may be provided by scattering or stacking the perovskite compound in a dielectric matrix.

In an embodiment, at least one of the first to third color conversion patterns may further include a scatterer. In an embodiment, the color conversion layer may further include first to third color filters respectively on the first to third color conversion patterns.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
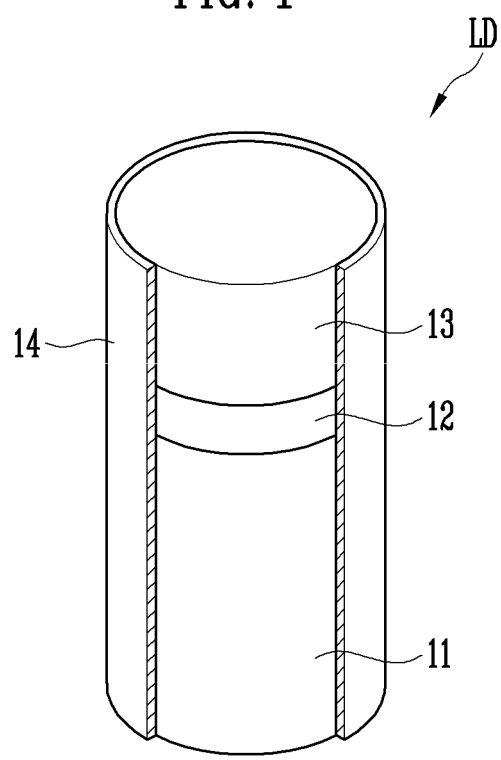
FIG. 1 is a perspective view illustrating a rod-type light emitting diode (LED) in accordance with an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, may be expected. Thus, embodiments should not be construed as limited to the particular shapes of regions illustrated herein but may include deviations in shapes that result, for example, from manufacturing. In the drawings, lengths and sizes of layers and regions may be exaggerated for clarity.

Like reference numerals in the drawings denote like elements. In the accompanying drawings, the dimensions of the structures are shown enlarged from the actual for the sake of clarity of the subject matter of the present disclosure.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, a singular form may include a plural form, unless the context clearly indicates otherwise.

In this application, the terms "comprises" or "having", etc., are used to specify that there is a stated feature, figure, act, operation, element, component or combination thereof, and that one or more other features should not be construed to preclude the presence or addition of one or more other features, integers, acts, operations, elements, components, or combinations thereof. Also, when a portion of a layer, a film, an area, a plate, or the like is referred to as being "on" another portion, this includes not only the case where it is "directly on" another portion, but also includes the case where it is in the middle thereof. In this disclosure, when a portion of a layer, a film, an area, a plate, or the like is formed on another portion, the forming direction is not limited to an upper direction but includes a side direction or a lower direction. On the contrary, when a portion of a layer, a film, an area, a plate, of the like is referred to as being "under" another portion, this includes not only the case where it is "directly underneath," but also includes the case where it is in the middle thereof.

Embodiments of the present disclosure will hereinafter be described in more detail with reference to the accompanying drawings.

FIG. 1 is a perspective view illustrating a rod-type light emitting diode as an example of a light emitting diode in accordance with an embodiment of the present disclosure.

Although in FIG. 1 the rod-type light emitting diode LD having a cylindrical shape has been illustrated, the present disclosure is not limited thereto. For example, as used herein, the term "rod-type light emitting diode" or "rod-type LED" may refer to a light emitting diode having a length that is longer than a width or circumference of the light emitting diode and may have any suitable shape.

Referring to FIG. 1, the rod-type light emitting diode LD in accordance with the embodiment of the present disclosure may include a first conductive semiconductor layer 11, a second conductive semiconductor layer 13, and an active layer 12 interposed between the first and second conductive semiconductor layers 11 and 13.

For example, the light emitting diode LD may be configured to have a stacked body formed by successively stacking the first conductive semiconductor layer 11, the active layer 12, and the second conductive semiconductor layer 13. In the following descriptions, for the sake of explanation, the rod-type light emitting diode LD will be referred to as "rod-type LED LD".

In an embodiment of the present disclosure, the rod-type LED LD may be in the form of a rod extending in one direction. If the direction in which the rod-type LED LD extends is defined as a longitudinal direction, the rod-type LED LD may have a first end and a second end with respect to the longitudinal direction in which the rod-type LED LD extends.

In an embodiment, one of the first and second conductive semiconductor layers 11 and 13 may be on the first end of the rod-type LED LD, and the other of the first and second conductive semiconductor layers 11 and 13 may be on the second end of the rod-type LED LD.

In an embodiment, the rod-type LED LD may have a cylindrical shape. As used herein, the term "rod type" encompasses a rod-like shape and a bar-like shape such as a cylindrical shape and a prismatic shape extending in the longitudinal direction (e.g., to have an aspect ratio greater than 1). For example, the length of the rod-type LED LD may be greater than the diameter or width thereof.

The rod-type LED LD may be fabricated to have a small size having a diameter and/or length corresponding to, e.g., a micro-scale or nano-scale size.

However, the size of the rod-type LED LD in accordance with an embodiment of the present disclosure is not limited to this, and the size of the rod-type LED LD may be changed depending on conditions of the display device to which the rod-type LED LD is applied.

The first conductive semiconductor layer 11 may include, e.g., at least one n-type semiconductor layer. For instance, the first conductive semiconductor layer 11 may include any semiconductor material including InAlGaN, GaN, AlGaN, InGaN, AlN, and/or InN, and a semiconductor layer which is doped with a first conductive dopant such as Si, Ge, and/or Sn.

The material forming the first conductive semiconductor layer 11 is not limited to this, and the first conductive semiconductor layer 11 may be include various other suitable materials.

The active layer 12 may be formed on the first conductive semiconductor layer 11 and have a single- or multi-quantum well structure. In an embodiment of the present disclosure, a cladding layer doped with a conductive dopant may be formed on and/or under the active layer 12. For example, the cladding layer may include an AlGaN layer or an InAlGaN layer. In addition, a material such as AlGaN or AlInGaN may be employed to form the active layer 12.

If an electric field of a set or predetermined voltage or more is applied to the opposite ends of the rod-type LED LD, the rod-type LED LD emits light by coupling of electron-hole pairs in the active layer 12.

The second conductive semiconductor layer 13 may be on the active layer 12 and include a semiconductor layer of a type different from that of the first conductive semiconductor layer 11. For example, the second conductive semiconductor layer 13 may include at least one p-type semiconductor layer. For instance, the second conductive semiconductor layer 13 may include any semiconductor material including InAlGaN, GaN, AlGaN, InGaN, AlN, and/or InN, and a semiconductor layer which is doped with a second conductive dopant such as Mg.

The material forming the second conductive semiconductor layer 13 is not limited to this, and the second conductive semiconductor layer 13 may include various other suitable materials.

In an embodiment of the present disclosure, the rod-type LED LD may not only include the first conductive semiconductor layer 11, the active layer 12, and the second conductive semiconductor layer 13, but may also include a fluorescent layer, another active layer, another semiconductor layer, and/or an electrode layer on and/or under each layer.

Furthermore, the rod-type LED LD may further include an insulating film 14. In an embodiment of the present disclosure, the insulating film 14 may be omitted, or may cover only some of the first conductive semiconductor layer 11, the active layer 12, and the second conductive semiconductor layer 13.

For example, the insulating film 14 may be on a portion of the rod-type LED LD, other than the opposite ends of the rod-type LED LD, so that the opposite ends of the rod-type LED LD are exposed.

Although in FIG. 1 there is illustrated the insulating film 14 from which a portion thereof has been removed for the sake of explanation, the actual rod-type LED LD may be formed such that the entirety (or substantially the entirety) of the side surface of the cylindrical body thereof is enclosed by the insulating film 14.

The insulating film 14 may enclose at least a portion of an outer circumferential surface of the first conductive semiconductor layer 11, the active layer 12, and/or the second conductive semiconductor layer 13. For example, the insulating film 14 may enclose the outer circumferential surface of the active layer 12.

In an embodiment of the present disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various suitable materials having insulating properties may be employed.

If the insulating film 14 is on the rod-type LED LD, the active layer 12 may prevent or reduce short-circuiting with a first and/or second electrode.

Furthermore, as a result of the presence of the insulating film 14, occurrence of a defect on the surface of the rod-type LED LD may be minimized or reduced, whereby the lifetime and efficiency of the rod-type LED LD may be improved. Even when a plurality of rod-type LEDs LD are adjacent to each other, the insulating film 14 may prevent or reduce undesirable short-circuiting of the rod-type LEDs LD therebetween.

The above-described rod-type LED LD may be used as a light emitting source for various suitable display devices. For example, the rod-type LED LD may be used in a lighting device or a self-luminance display device.

In an embodiment, the light emitting diode according to the present disclosure may have a structure such that respective layers corresponding to the first conductive semiconductor layer 11, the active layer 12, and the second conductive semiconductor layer 13 of the rod-type LED LD are longitudinally stacked on an emission area.

Figure 2:
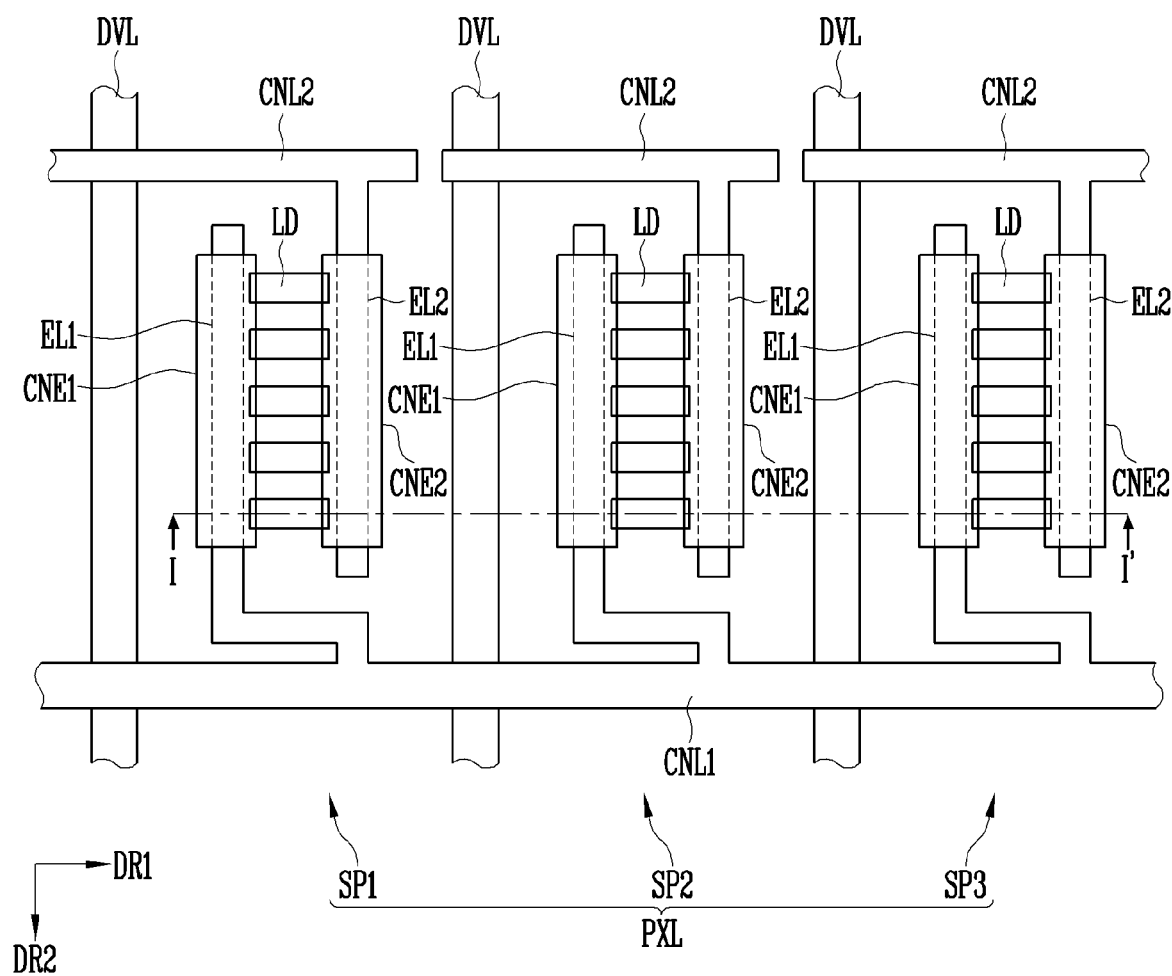
FIG. 2 is a plan view schematically illustrating first to third sub-pixels included in a pixel of a display device including rod-type light emitting diodes of FIG. 1, in accordance with an embodiment of the present disclosure.
Figure 3:
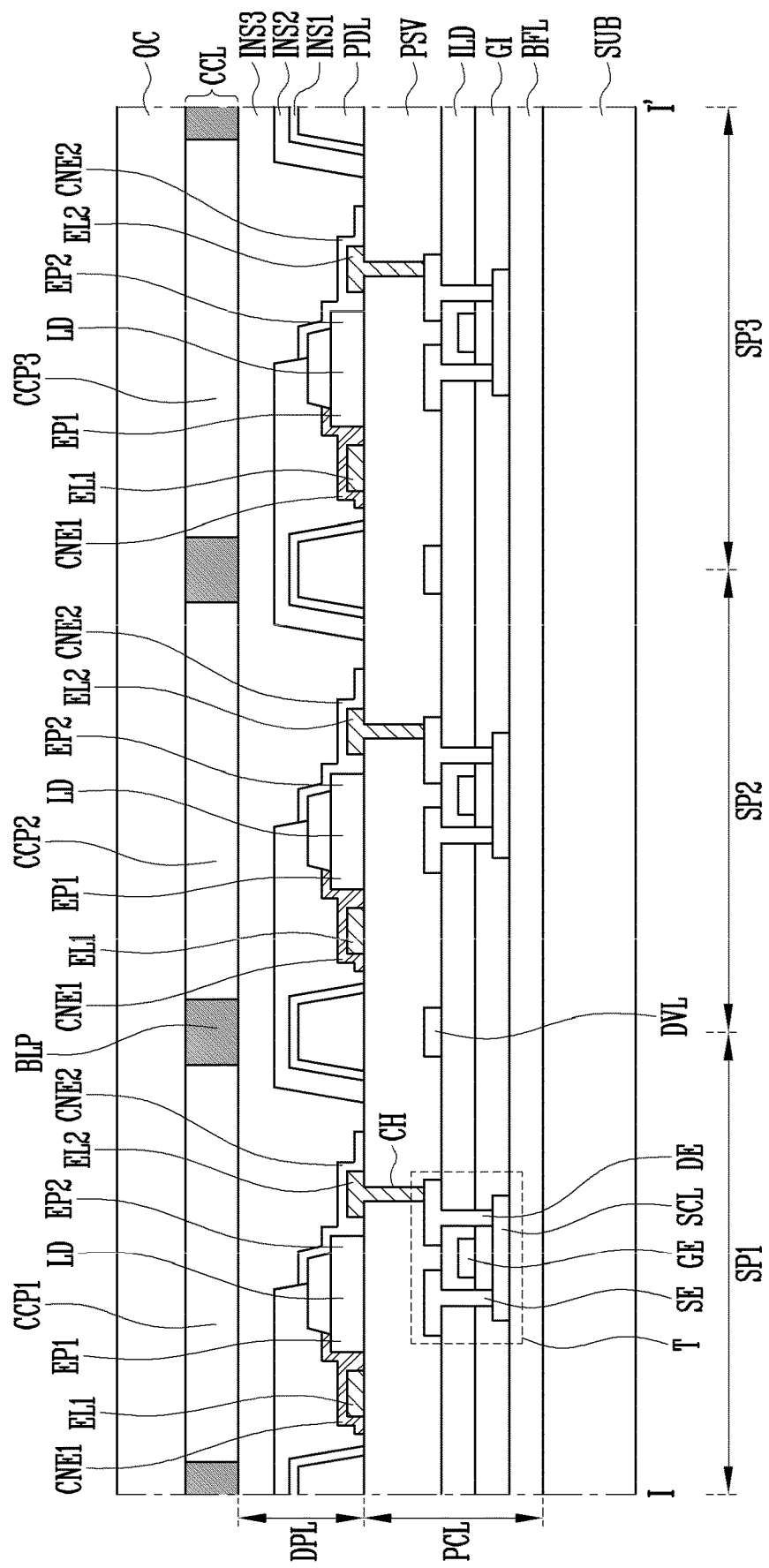
FIG. 3 is a cross-sectional view taken along line I-I' of FIG. 2, in accordance with an embodiment of the present disclosure.

FIG. 2 is a plan view schematically illustrating first to third sub-pixels included in a pixel of a display device including rod-type light emitting diode of FIG. 1, in accordance with an embodiment of the present disclosure. FIG. 3 is a cross-sectional view taken along line I-I' of FIG. 2, in accordance with an embodiment of the present disclosure.

In FIG. 2, for the sake of explanation, a plurality of rod-type LEDs are illustrated as being horizontally arranged. However, the arrangement of the rod-type LEDs is not limited thereto.

Furthermore, in FIG. 2, for the sake of explanation, each rod-type LED is illustrated as being horizontally oriented. However, the orientation of the rod-type LED is not limited thereto. For example, each rod-type LED may be oriented in an oblique direction between first and second electrodes. Furthermore, for the sake of explanation, illustration of transistors coupled to the rod-type LEDs and signal lines coupled to the transistors has been omitted.

In FIG. 2, a unit emission area may be a pixel area including a pixel provided with the first to third sub-pixels.

Referring to FIGS. 1-3, the display device in accordance with an embodiment of the present disclosure may include a plurality of pixels PXL. Each pixel PXL may include a first sub-pixel SP1, a second sub-pixel SP2, and a third sub-pixel SP3 which are on a substrate SUB.

The first to third sub-pixels SP1, SP2, and SP3 may correspond to a pixel area for displaying an image in the pixel PXL, and may correspond to an emission area from which light is emitted. Each of the first to third sub-pixels SP1, SP2, and SP3 may include an LED configured to emit white light and/or color light. Each such-pixel SP1, SP2, SP3 may be configured to emit light having any color chosen from among red, green, and blue, and it is not limited thereto. For example, each of the first to third sub-pixels SP1, SP2, and SP3 may be configured to emit light having any color chosen from among cyan, magenta, yellow, and white.

Each of the first to third sub-pixels SP1, SP2, and SP3 may include the substrate SUB, a pixel circuit layer PCL, and a display element layer DPL.

The substrate SUB may include an insulating material such as glass, an organic polymer, and/or crystal. Furthermore, the substrate SUB may be made of a material having flexibility so as to be bendable or foldable, and have a single-layer or multi-layer structure. For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may be changed in various suitable ways.

The pixel circuit layer PCL may include a buffer layer BFL on the substrate SUB, a transistor T on the buffer layer BFL, and a driving voltage line DVL.

The buffer layer BFL may prevent or reduce the diffusion of impurities into the transistor T. The buffer layer BFL may have a single-layer structure, or may have a multi-layer structure having two or more layers.

In the case where the buffer layer BFL has a multi-layer structure, the respective layers may include the same material or different materials. The buffer layer BFL may be omitted depending on the material of the substrate SUB or processing conditions.

The transistor T may be electrically coupled to (e.g., electrically connected to) the plurality of rod-type LEDs LD included in the display element layer DPL so as to drive the rod-type LEDs LD. The transistor T may include a semiconductor layer SCL, a gate electrode GE, a source electrode SE, and a drain electrode DE.

The semiconductor layer SCL may be on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern including polysilicon, amorphous silicon, an oxide semiconductor, etc. The channel area may be an intrinsic semiconductor (e.g., an undoped semiconductor pattern). Each of the source area and the drain area may be a semiconductor pattern doped with impurities.

The gate electrode GE may be on the semiconductor layer SCL with a gate insulating layer GI interposed therebetween.

The source electrode SE and the drain electrode DE may respectively come into contact with the source area and the drain area of the semiconductor layer SCL through corresponding contact holes which pass through an interlayer insulating layer ILD and the gate insulating layer GI.

Although the transistor T has been illustrated as having a top-gate structure, it may have a bottom-gate structure, as needed.

A passivation layer PSV may be on the transistor T.

In some embodiments, the driving voltage line DVL may be on the interlayer insulating layer ILD, and may extend in a second direction DR2 in a plan view. The driving voltage line DVL may be electrically coupled to (e.g., electrically connected to) the display element layer DPL through a contact hole which passes through the passivation layer PSV.

The display element layer DPL may include the rod-type LEDs LD on the passivation layer PSV.

Each of the rod-type LEDs LD may include a first conductive semiconductor layer 11, a second conductive semiconductor layer 13, and an active layer 12 interposed between the first and second conductive semiconductor layers 11 and 13.

The rod-type LED LD may include a first end EP1 and a second end EP2 with respect to a first direction DR1. One of the first and second conductive semiconductor layers 11 and 13 may be on the first end EP1, and the other of the first and second conductive semiconductor layers 11 and 13 may be on the second end EP2.

The rod-type LED LD may be configured to emit white light or color light. For example, the rod-type LED LD may be configured to emit blue-based light, but it is not limited thereto.

Hereinafter, for the sake of explanation, the color light will be referred to as "blue light," but the present disclosure is not limited thereto.

The display element layer DPL may further include a partition wall PDL, first and second electrodes EL1 and EL2, first and second contact electrodes CNE1 and CNE2, and first and second connection lines CNL1 and CNL2.

The partition wall PDL may be on the passivation layer PSV and used to define an emission area in each of the first to third sub-pixels SP1, SP2, and SP3. The partition wall PDL may include an opening which exposes the rod-type LEDs LD included in each of the first to third sub-pixels SP1, SP2, and SP3.

In this embodiment, adjacent partition walls PDL may be over the substrate SUB at positions spaced apart from each other by a set or predetermined distance. For example, the adjacent partition walls PDL may be over the substrate SUB at positions spaced apart from each other by a distance greater than the length of the rod-type LED LD. Each partition wall PDL may include an insulating material including an inorganic material or an organic material, but it is not limited thereto.

In an embodiment of the present disclosure, the partition wall PDL may be made of an insulating material including an organic material. For example, the partition wall PDL may include at least one selected from polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

A first insulating layer INS1 may be on the substrate SUB including the partition walls PDL. The first insulating layer INS1 may cover a portion of an upper surface of each of the rod-type LEDs LD in each of the first to third sub-pixels SP1, SP2, and SP3. Due to the above-mentioned structure of the first insulating layer INS1, the first end EP1 and the second end EP2 of each rod-type LED LD may be exposed to the outside.

The first electrode EU may be on the passivation layer PSV. The first electrode EL1 may be adjacent to either the first or second ends EP1 or EP2 of the corresponding rod-type LEDs LD, and may be electrically coupled to the corresponding rod-type LEDs LD by the first contact electrode CNE1.

The first electrode EU may be electrically coupled with the driving voltage line DVL through a contact hole.

The first electrode EU may be provided as a part of the first connection line CNL1, or may be in the form of a protrusion extending from the first connection line CNL1. The first connection line CNL1 may be a line configured to apply a voltage to the first electrode EL1 when the corresponding rod-type LEDs LD are aligned.

The second electrode EL2 may be adjacent to the other of the first and second ends EP1 and EP2 of the corresponding rod-type LEDs LD, and may be electrically coupled to the corresponding rod-type LEDs LD by the second contact electrode CNE2. The respective second electrodes EL2 included in the first to third sub-pixels SP1, SP2, and SP3 may be electrically coupled by (e.g., electrically connected by) the second connection line CNL2.

The second electrode EL2 may be electrically coupled to (e.g., electrically connected to) the drain electrode DE of the transistor T through a contact hole CH passing through the passivation layer PSV so that the second electrode EL2 may be supplied with a signal through the transistor T.

The second electrode EL2 may be provided as a part of the second connection line CNL2, or may be in the form of a protrusion extending from the second connection line CNL2. The second connection line CNL2 may be a line configured to apply a voltage to the second electrode EL2 when the corresponding rod-type LEDs LD are aligned.

In an embodiment of the present disclosure, the first electrode EL1 and the first connection line CNL1 may be integrally provided, and the second electrode EL2 and the second connection line CNL2 may be integrally provided.

The first electrode EU and the second electrode EL2 may be on the same (or substantially the same) plane, and have the same (or substantially the same) height. If the first electrode EL1 and the second electrode EL2 have the same (or substantially the same) height, the rod-type LEDs LD may be more reliably coupled to the first and second electrodes EL1 and EL2.

The first electrode EU, the second electrode EL2, the first connection line CNL1, and the second connection line CNL2 may include the same (or substantially the same) material. For example, the first electrode EU, the second electrode EL2, the first connection line CNL1, and the second connection line CNL2 may include a conductive material.

The conductive material may include a metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

Although each of the first electrode EL1, the second electrode EL2, the first connection line CNL1, and the second connection line CNL2 may have a single layer, it is not limited thereto, and it may have, for example, a multilayer structure formed by stacking two or more layers each including metal, an alloy, a conductive oxide, or a conductive polymer. Here, the materials of the first electrode EL1, the second electrode EL2, the first connection line CNL1, and the second connection line CNL2 are not limited to the above-mentioned materials. For example, the first electrode EU, the second electrode EL2, the first connection line CNL1, and the second connection line CNL2 may be made of a conductive material having a set or predetermined reflectivity to allow light emitted from the opposite ends of the rod-type LED LD to travel in a direction (e.g., in a frontal direction) in which an image is displayed.

The rod-type LEDs LD may be over the substrate SUB between the first and second electrodes EL1 and EL2. The rod-type LEDs LD may be induced to be self-aligned by an electric field formed between the first and second electrodes EL1 and EL2. Here, each rod-type LED LD may be in the form of a rod extending in the first direction DR1.

The first end EP1 of the rod-type LED LD may be adjacent to the first electrode EL1, and the second end EP2 of the rod-type LED LD may be adjacent to one side of the second electrode EL2.

The first contact electrode CNE1 for electrically and/or physically reliably coupling (e.g., connecting) the first electrode EL1 with the corresponding rod-type LEDs LD may be on the first electrode EL1. In a plan view, the first contact electrode CNE1 may overlap with the first electrode EL1.

The first contact electrode CNE1 may come into ohmic contact with the first electrode EL1.

The first ends EP1 of the rod-type LEDs LD may be electrically and/or physically reliably coupled to the first electrode EU by the first contact electrode CNE1. Thereby, a voltage applied to the driving voltage line DVL may be applied to the first ends EP1 of the corresponding rod-type LEDs LD through the first electrode EL1 and the first contact electrode CNE1.

The first contact electrode CNE1 may be made of a transparent conductive material such as ITO, IZO, or ITZO to allow light emitted from the rod-type LEDs LD to pass through the first contact electrode CNE1, but it is not limited thereto.

In a plan view, the first contact electrode CNE1 may cover the first electrode EL1 and overlap with the first electrode EL1. Furthermore, the first contact electrode CNE1 may partially overlap with the first ends EP1 of the rod-type LEDs LD.

A second insulating layer INS2 may be on the substrate SUB including the first contact electrode CNE1. The second insulating layer INS2 may prevent or reduce exposure of the first contact electrode CNE1 to the outside, thus preventing or reducing corrosion of the first contact electrode CNE1. The second insulating layer INS2 may be include an inorganic insulating layer including an inorganic material, or an organic insulating layer including an organic material.

The second contact electrode CNE2 for electrically and/or physically reliably coupling (e.g., connecting) the second electrode EL2 with the corresponding rod-type LEDs LD may be on the second electrode EL2. In a plan view, the second contact electrode CNE2 may overlap with the second electrode EL2.

The second contact electrode CNE2 may come into ohmic contact with the second electrode EL2. The respective second ends EP2 of the rod-type LEDs LD may be electrically coupled to the second electrode EL2 by the second contact electrode CNE2. Thereby, the voltage of the transistor T may be applied to the respective second ends EP2 of the rod-type LEDs LD through the second electrode EL2 and the second contact electrode CNE2.

As such, since set or predetermined voltages are applied to the opposite ends EP1 and EP2 of the rod-type LEDs LD through the first electrode EL1 and the second electrode EL2, the rod-type LEDs LD may emit blue light.

The second contact electrode CNE2 may be made of the same (or substantially the same) material as that of the first contact electrode CNE1, but it is not limited thereto.

A third insulating layer INS3 may be on the substrate SUB including the second contact electrode CNE2. The third insulating layer INS3 may cover the second contact electrode CNE2 so that exposure to the outside and corrosion of the second contact electrode CNE2 under the third insulating layer INS3 may be prevented or reduced. The third insulating layer INS3 may include an inorganic insulating layer including an inorganic material, or an organic insulating layer including an organic material.

The display device may further include a color conversion layer CCL on the third insulating layer INS3.

The color conversion layer CCL may be configured to convert the blue light emitted from the rod-type LEDs LD into light having a set or specific color according to each sub-pixel.

In an embodiment of the present disclosure, the color conversion layer CCL may include first to third color conversion patterns CCP1, CCP2, and CCP3. Here, the first to third color conversion patterns CCP1, CCP2, and CCP3 may correspond to the respective sub-pixels.

For example, the first color conversion pattern CCP1 may correspond to the first sub-pixel SP1, the second color conversion pattern CCP2 may correspond to the second sub-pixel SP2, and the third color conversion pattern CCP3 may correspond to the third sub-pixel SP3.

In an embodiment of the present disclosure, the first to third color conversion patterns CCP1, CCP2, and CCP3 may have the following configurations.

At least one color conversion pattern of the first to third color conversion patterns may include a color conversion particle. For example, two color conversion patterns of the first to third color conversion patterns may include color conversion particles.

In an embodiment, the first color conversion pattern CCP1 and the second color conversion pattern CCP2 may respectively include first and second color conversion particles.

The first color conversion pattern CCP1 may be configured to convert light emitted from the rod-type LEDs LD of the first sub-pixel SP1 into red light. The first color conversion pattern CCP1 may absorb the blue light, shift the wavelength thereof by energy transition, and thus, emit red light having a wavelength in a range of 620 nm to 780 nm.

The first color conversion pattern CCP1 may include a first color conversion particle. The first color conversion particle may be a perovskite compound. The first color conversion particle may be a red perovskite compound.

Each perovskite compound may be a compound having a perovskite structure. The term "perovskite compound," as used in this disclosure, encompasses not only the compound having the perovskite structure but also a compound having a double-perovskite structure or a compound having a perovskite-like structure.

The compound having the perovskite structure may include structures having three or four identical or different anions, and two metal atoms which carry two or three positive charges. The compound having the perovskite structure may be a compound represented by formula 1 below:

$$AMX_3 \qquad \text{Formula 1}$$

wherein A may be a monovalent organic cation or a monovalent transition metal or alkali metal cation; M may be a divalent transition metal, rare earth metal, alkaline earth metal, Pb, Sn, Ge, Ga, In, Al, Sb, Bi or Po cation; X may be selected from the group consisting of halogen anions and combinations thereof; and two or more of X may be the same or different.

When A in formula 1 is a monovalent organic cation, the compound having the perovskite structure may have an organic/inorganic hybrid perovskite structure, and the organic cation may include, but is not limited to, an organic ammonium cation, an organic phosphonium cation, an organic pyridinium cation, an organic imidazolium cation or an organic sulfonium cation.

The organic group of the organic cation may be selected from among hydrogen, an alkyl group, a hydroxyalkyl group, an alkenyl group, an aryl group, and combinations thereof. The alkyl group may be an unsubstituted or substituted $C_1$ to $C_{24}$ linear or branched alkyl group or an unsubstituted or substituted $C_3$ to $C_{20}$ cycloalkyl group; the hydroxyalkyl group may be an unsubstituted or substituted $C_1$ to $C_6$ hydroxyalkyl group; the alkenyl group may be an unsubstituted or substituted $C_{10}$ to $C_{20}$ alkenyl group; and the aryl group may be selected from the group consisting of unsubstituted or substituted $C_6$ to $C_{20}$ aryl groups and combinations thereof.

For example, the organic ammonium cation constituting A in formula 1 may be a monovalent organic ammonium ion represented by $(R_1R_2R_3R_4N)^+$ or $(R_1R_2N=CH-NR_3R_4)^+$, wherein $R_1$ to $R_4$ may be independently selected from the group consisting of H, an unsubstituted or halogen-substituted $C_1$ to $C_{24}$ linear or branched alkyl group, an unsubstituted or halogen-substituted $C_3$ to $C_{20}$ cycloalkyl group, an unsubstituted or halogen-substituted $C_6$ to $C_{20}$ aryl group, and combinations thereof, but are not limited thereto. For example, the organic ammonium cation may be an unsubstituted or halogen-substituted $C_1$ to $C_{10}$ alkylammonium or $C_1$ to $C_{10}$ alkylenediammonium amine. In some embodiments, the organic ammonium ion constituting A in formula 1 may be a monovalent cation of methyl amine, ethyl amine, methylene diamine, ethylene diamine, tetraethylamine, benzyltrimethylamine or benzyltriethylamine, but is not limited thereto.

For example, the organic phosphonium cation constituting A in formula 1 may be a monovalent organic phosphonium ion represented by $(R_1R_2R_3R_4P)^+$, wherein $R_1$ to $R_4$ may be independently selected from the group consisting of H, an unsubstituted or halogen-substituted $C_1$ to $C_{24}$ linear or branched alkyl group, an unsubstituted or halogen-substituted $C_3$ to $C_{20}$ cycloalkyl group, an unsubstituted or halogen-substituted $C_6$ to $C_{20}$ aryl group, and combinations thereof, but are not limited thereto. Examples of the organic phosphonium ion constituting A in formula 1 include, but are not limited to, tetraalkylphosphonium ions, such as tetraethylphosphonium, tetrabutylphosphonium or tetraphenylphosphonium cations, triethylbenzylphosphonium, trimethyldecylphosphonium, methyltriphenylphosphonium, tributylarylphosphonium and diphenyldioctylphosphonium cations, and the like.

In addition, when A in formula 1 is a monovalent transition metal cation, the compound having the perovskite structure may have a transition metal perovskite structure. The transition metal of A in formula 1 may be Ti.

Furthermore, when A in formula 1 is a monovalent alkali metal cation, the compound having the perovskite structure may have an inorganic metal perovskite structure. The alkali metal of A in formula 1 may be Na, K, Rb, Cs or Fr.

The halogen anion in formula 1 may be Cl⁻, Br⁻, or I⁻.

When the compound having the perovskite structure has an organic/inorganic perovskite structure, it has a feature that it may emit light having high color purity. For example, when the compound having the perovskite structure has an inorganic metal perovskite structure, it may have features of material stability.

Examples of the compound having the perovskite structure may include, but are not limited to, $CsPbX_3$ and $CsSbX_3$ such as, for example, $CsPbCl_3$, $CsPbBr_3$, $CsPbI_3$, $CsSbCl_3$, $CsSbBr_3$, and $CsSbI_3$.

Alternatively, the compound having the perovskite-like structure may be a compound represented by formula 2 below:

$$A_3M_2X_9 \qquad \text{Formula 2}$$

wherein A may be selected from the group consisting of monovalent organic cations, monovalent transition metal and alkali metal cations, and combinations thereof; M may be selected from the group consisting of trivalent cations and combinations thereof; X may be selected from the group consisting of halogen anions and combinations thereof; and two or more of A, M or X may be the same or different.

Hereinafter, the definitions of A, M and X will be described with focus on those which are different from those described above with respect to formula 1, and the omitted contents are as described above with respect to formula 1.

In formula 2, the trivalent cation may be a trivalent cation of metalloid or post-transition metal, for example, $Sb^{3+}$ or $Bi^{3+}$, but is not limited thereto.

Examples of the compound having the perovskite-like structure may include, but are not limited to, $Cs_3Sb_2X_9$ such as, for example, $Cs_3Sb_2Cl_9$, $Cs_3Sb_2Br_9$, and $Cs_3Sb_2I_9$.

The compound having the double perovskite structure may be a compound represented by formula 3 below:

$$A_2MM'X_6 \qquad \text{Formula 3}$$

wherein A may be selected from the group consisting of monovalent organic cations, monovalent transition metal and alkali metal cations, and combinations thereof; M may be a monovalent transition metal, alkali metal or In cation; M' may be a trivalent cation; X may be selected from the group consisting of halogen anions and combinations thereof; and two or more of A, M or X may be the same or different.

The definitions of A, M, M' and X are as described above with respect to formula 1 or 2.

Alternatively, the compound having the perovskite-like structure may be a compound represented by formula 4 below:

$$A_2MX_4 \qquad \text{Formula 4}$$

wherein A may be selected from the group consisting of monovalent organic cations, monovalent transition metal and alkali metal cations, and combinations thereof; M may be a divalent metal cation; X may be selected from the group consisting of halogen anions and combinations thereof; and two or more of A or X may be the same or different.

Hereinafter, the definitions of A, M and X will be described with focus on those which are different from those described above with respect to formula 1, and the omitted contents are as described above with respect to formula 1.

In formula 4, the divalent metal cation constituting M may be a divalent cation of a transition metal or other suitable metal, for example, $Mn^{2+}$ or $Zn^{2+}$, but is not limited thereto.

The perovskite compound may have the form of a nanocrystal, a nanoplate, a nanosheet, or the like.

The perovskite compound may form a composite with a polymer (e.g., the composite may include the perovskite compound and the polymer). The polymer that is used for composite formation may be, for example, polystyrene, polycarbonate, acrylonitrile butadiene styrene, or polyvinyl chloride, but is not limited thereto. When the perovskite compound forms a composite with the polymer (e.g., when the perovskite compound is chemically or physically bonded to the polymer), the water resistance and heat resistance thereof may be enhanced.

In this embodiment of the present disclosure, although the first color conversion pattern CCP1 has been illustrated as being over the rod-type LEDs LD of the first sub-pixel SP1, the present disclosure is not limited thereto. For example, the first color conversion pattern CCP1 may be beside or under the rod-type LEDs LD in the first sub-pixel SP1. The second color conversion pattern CCP2 may be configured to convert blue light emitted from the rod-type LEDs LD of the second sub-pixel SP2 into green light. The second color conversion pattern CCP2 may absorb the blue light, shift the wavelength thereof by energy transition, and thus emit green light having a wavelength in a range of 500 nm to 565 nm.

The second color conversion pattern CCP2 may include a second color conversion particle. The second color conversion particle may be a perovskite compound. The second color conversion particle may be a green perovskite compound.

In this embodiment of the present disclosure, although the second color conversion pattern CCP2 has been illustrated as being over the rod-type LEDs LD of the second sub-pixel SP2, the present disclosure is not limited thereto. For example, the second color conversion pattern CCP2 may be beside or under the rod-type LEDs LD in the second sub-pixel SP2.

At least one of the first and second color conversion patterns CCP1 and CCP2 may selectively further include a quantum dot, for example, a red quantum dot or a green quantum dot.

The quantum dot may include at least one material of a group II compound semiconductor, a group III compound semiconductor, a V group compound semiconductor, and a VI group compound semiconductor. In more detail, a core nanocrystal forming a quantum dot particle may include at least one selected from the group consisting of CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN InAs, and ZnO. Furthermore, a shell nanocrystal may include at least one selected from the group consisting of CdS, CdSe, CdTe, CdO, ZnS, ZnSe, ZNSeS, ZnTe, ZnO, InP, InS, GaP, GaN, GaO, InZnP, InGaP, InGaN, InZnSCdSe, PbS, TiO, SrSe, and HgSe.

For example, in the case where the core nanocrystal includes CdSe, blue light may be generated when the diameter of the quantum dot is in a range of 1 nm to 3 nm, green light may be generated when the diameter of the quantum dot is in a range of 3 nm to 5 nm, and red light may be generated when the diameter of the quantum dot is in a range of 7 nm to 10 nm. However, the present disclosure is not limited to this.

The quantum dot may have any suitable shape that is generally used in the art, and is not specifically limited. For example, a spherical, pyramid-shaped, multi-arm shaped, or cubic nanoparticle, nanotube, nanowire, nanofiber, and nanoplate particle may be employed.

Generally, quantum dots have characteristics in which the larger the wavelength of incident light, the smaller the absorption coefficient. For example, the absorption coefficients of red and green quantum dots are markedly reduced when light having a wavelength of 450 nm or more is incident.

Therefore, when light having a wavelength of 450 nm or more is incident on a color conversion layer CCL including only a red or green quantum dot, the efficiency of light ultimately emitted from the red or green quantum dot is reduced.

Light emitted from the perovskite compound may have a relatively small full width at half maximum (FWHM) value. In other words, light emitted from the perovskite compound may exhibit relatively high color purity. The perovskite compound may resemble a single crystal having a quantum well, so that electrons and holes may be directly coupled to the perovskite compound. The perovskite compound may include relatively few parts that are not involved in light emission. Hence, as described in this embodiment of the present disclosure, if the color conversion layer CCL includes the perovskite compound, the display device may have an increased color gamut.

Therefore, in the case where the blue light is incident on the perovskite compound such as, for example, on the green perovskite compound, the efficiency of light ultimately emitted from the second sub-pixel SP2 may increase due to an increase in absorption coefficient.

Thereby, the luminance of the display device in accordance with an embodiment of the present disclosure may be improved, and the quality of an image ultimately displayed on the display device may be enhanced.

The first and second color conversion patterns CCP1 and CCP2 may be provided in such a way that the color conversion particles, i.e., perovskite compounds and/or quantum dots, are evenly or unevenly scattered or stacked in a dielectric matrix depending on the form of the color conversion particles.

The third color conversion pattern CCP3 may allow the blue light emitted from the rod-type LEDs LD to directly pass through the third color conversion pattern CCP3. To this end, the third color conversion pattern CCP3 may include a transparent layer.

The transparent layer may include a transparent polymer to allow the blue light emitted from the rod-type LEDs LD to pass therethrough and be directly emitted.

The transparent layer may further include blue pigment. The blue pigment may absorb at least one of red light and green light included in external light.

The third color conversion pattern CCP3 including the transparent layer may be configured to directly emit the blue light that is incident on the third color conversion pattern CCP3, without having a separate color conversion particle. Hence, the intensity of light emitted from the third sub-pixel SP3 may be enhanced.

At least one of the first to third color conversion patterns CCP1, CCP2, and CCP3 may further include a scatterer. The scatterer may include, e.g., at least one selected from among $TiO_2$, $Al_2O_3$, $SiO_2$, and ZnO, but it is not limited thereto. The scatterer may scatter light which is incident on the first to third color conversion patterns CCP1, CCP2, and CCP3 so as to increase the intensity of light emitted from the first to third color conversion patterns CCP1, CCP2, and CCP3 or make the frontal luminance and the side luminance of the light uniform (or substantially uniform).

The color conversion layer CCL may further include light shielding patterns BLP between the first to third color conversion patterns CCP1, CCP2, and CCP3. The light shielding patterns BLP between the first to third color conversion patterns CCP1, CCP2, and CCP3 may prevent or reduce color mixture between the first to third color conversion patterns CCP1, CCP2, and CCP3.

Furthermore, each of the light shielding patterns BLP may be at a non-emission area other than the emission area of the corresponding sub-pixel, and may prevent or reduce visibility from the outside of the transistor T, the driving voltage line DVL, etc. that are at the non-emission area.

The light shielding pattern BLP may include a black matrix, but it is not limited thereto. For example, the light shielding pattern BLP may be made of other suitable materials capable of blocking light.

An overcoat layer OC may be on the color conversion layer CCL. The overcoat layer OC may function as a planarization layer for planarizing a stepped structure formed by the components under the overcoat layer OC. In addition, the overcoat layer OC may function as an encapsulation layer for preventing or reducing penetration of oxygen or water into the rod-type LEDs LD.

Figure 4:
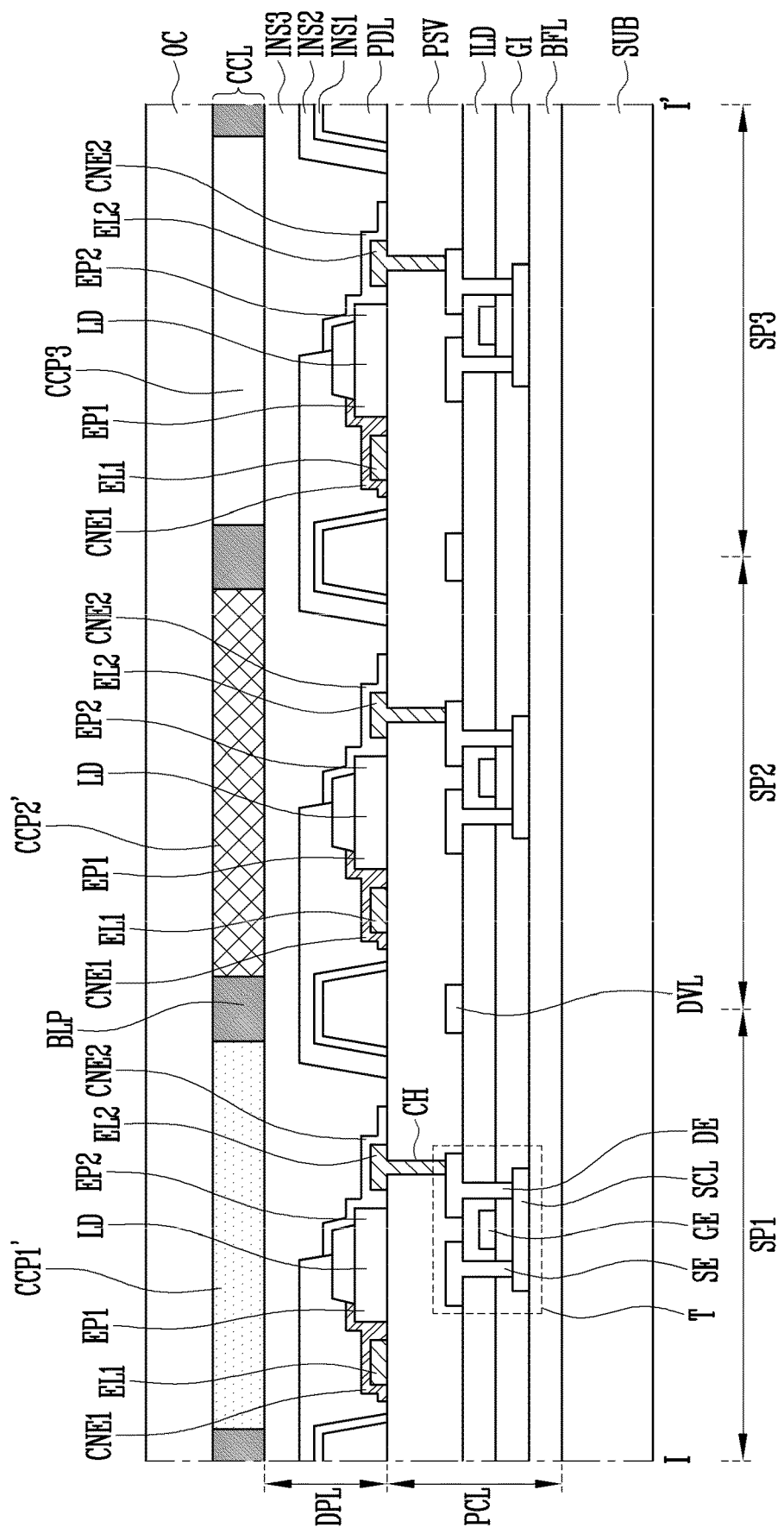
FIG. 4 is a cross-sectional view taken along line I-I' of FIG. 2, in accordance with an embodiment of the present disclosure.

FIG. 4 is a cross-sectional view taken along line I-I' of FIG. 2, in accordance with an embodiment of the present disclosure.

Referring to FIGS. 1 and 2-4, a display device in accordance with this embodiment of the present disclosure may include first to third sub-pixels SP1, SP2, and SP3. Each of the first to third sub-pixels SP1, SP2, and SP3 may include a substrate SUB, a pixel circuit layer PCL, a display element layer DPL, a color conversion layer CCL, and an overcoat layer OC.

In the following description, the display device in accordance with the present embodiment will be explained, focusing on differences between it and the preceding embodiment, and repetitive explanations thereof will not be repeated here.

The first color conversion pattern CCP1' may include a first color conversion particle. The first color conversion particle may be a quantum dot.

For example, the first color conversion pattern CCP1' may be configured to convert light emitted from the rod-type LEDs LD of the first sub-pixel SP1 into red light. Here, the first color conversion particle may be a red quantum dot.

The second color conversion pattern CCP2' may include a second color conversion particle. The second color conversion particle may be a perovskite compound.

For example, the second color conversion pattern CCP2' may be configured to convert light emitted from the rod-type LEDs LD of the second sub-pixel SP2 into green light. Here, the second color conversion particle may be a green perovskite compound.

The second color conversion particle may further include a quantum dot, e.g., a green quantum dot.

Figure 5:
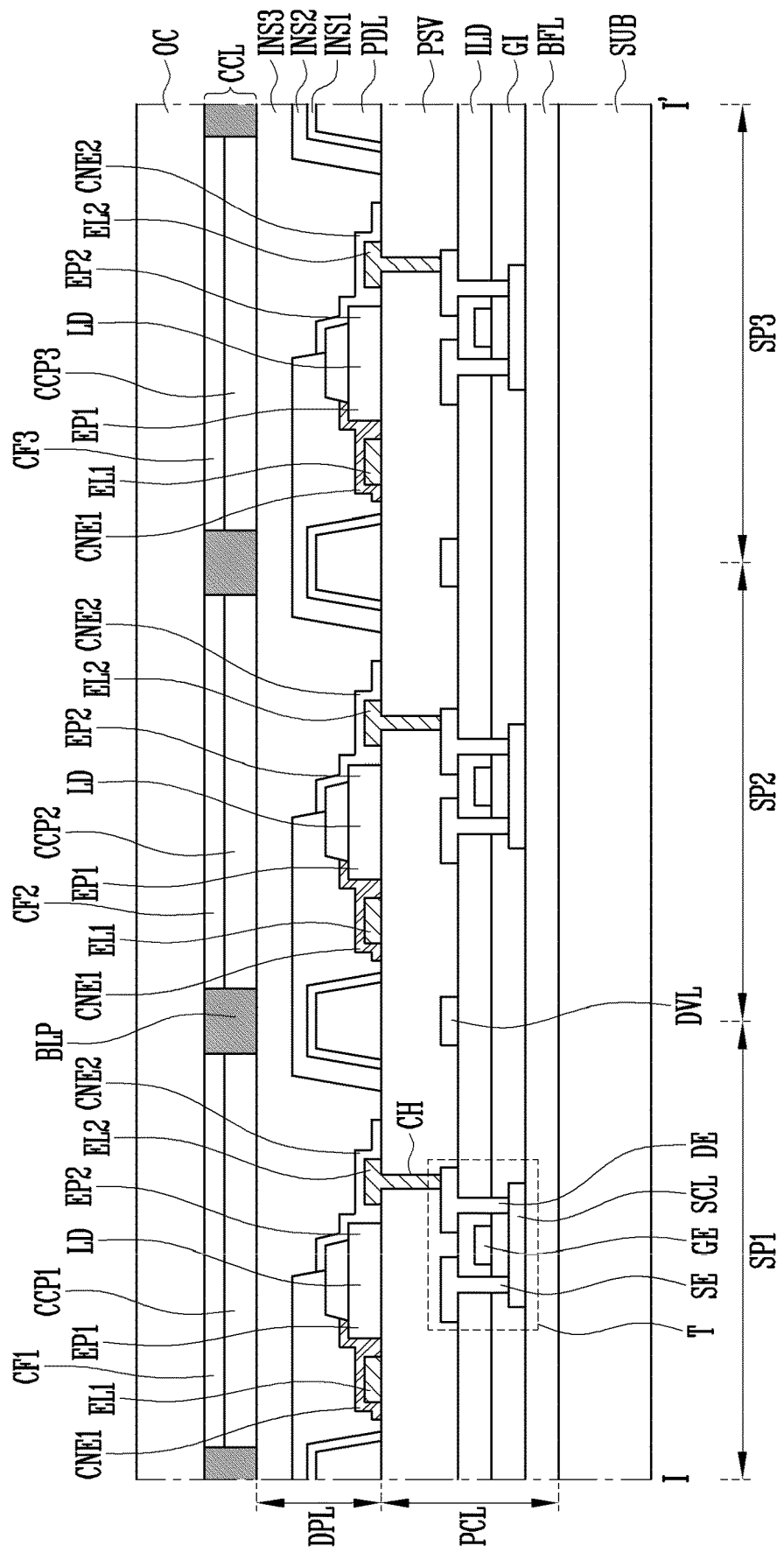
FIG. 5 is a cross-sectional view taken along line I-I' of FIG. 2, in accordance with an embodiment of the present disclosure.

FIG. 5 is a cross-sectional view taken along line I-I' of FIG. 2, in accordance with an embodiment of the present disclosure.

Referring to FIGS. 1 and 2-5, a display device in according to this embodiment of the present disclosure may include first to third sub-pixels SP1, SP2, and SP3. Each of the first to third sub-pixels SP1, SP2, and SP3 may include a substrate SUB, a pixel circuit layer PCL, a display element layer DPL, a color conversion layer CCL, and an overcoat layer OC.

In the following description, the display device in accordance with the present embodiment will be explained, focusing on differences between it and the preceding embodiment, and repetitive explanations thereof will not be repeated here.

In this embodiment of the present disclosure, the color conversion layer CCL may further include first to third color filters CF1, CF2, and CF3 which are respectively on the first to third color conversion patterns CCP1, CCP2, and CCP3.

For example, the first color filter CF1 may correspond to the first color conversion layer CCL1, the second color filter CF2 may correspond to the second color conversion layer CCL2, and the third color filter CF3 may correspond to the third color conversion layer CCL3.

Each of the first to third color filters CF1, CF2, and CF3 may be at a position corresponding to at least one direction in which light emitted from the color conversion layer CCL travels.

Each of the first to third color filter CF1, CF2, and CF3 may be configured to transmit only light of a set or specific color, e.g., red, green, or blue, according to the corresponding sub-pixel, among light emitted from the respective color conversion patterns CCP1, CCP2, and CCP3. In an embodiment, the first color filter CF1 may be configured to transmit red light emitted from the first color conversion pattern CCP1, and block light other than red light. The second color filter CF2 may be configured to transmit green light emitted from the second color conversion pattern CCP2, and block light other than green light. The third color filter CF3 may be configured to transmit blue light emitted from the third color conversion pattern CCP3, and block light other than blue light.

Each of the first to third color filters CF1, CF2, and CF3 may include a photosensitive resin including a pigment of a set or specific color corresponding to the associated sub-pixel. In an embodiment, the first color filter CF1 may include a photosensitive resin including a red pigment, the second color filter CF2 may include a photosensitive resin including a green pigment, and the third color filter CF3 may include a photosensitive resin including a blue pigment.

The display device in accordance with an embodiment of the present disclosure may be employed in various suitable electronic devices. For instance, the display device may be applied to a television, a notebook computer, a cellular phone, a smartphone, a smartpad (PD), a portable multimedia player (PMP), a personal digital assistant (PDA), a navigation device, various suitable kinds of wearable devices such as a smartwatch, etc.

Various embodiments of the present disclosure may provide a display device having improved display quality, e.g., an improved color gamut.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Those skilled in the art to which the present disclosure pertains will understand that the present disclosure may be practiced in other detailed forms without departing from the technical spirit or scope of the present disclosure. Therefore, it should be understood that the above-described embodiments are only exemplary in all aspects rather than being restrictive. It is intended that the scope of the present disclosure should be defined by the accompanying claims, and equivalents thereof, rather than the above-described descriptions, and various modifications, additions and substitutions, which can be derived from the meaning, scope and equivalent concepts of the accompanying claims, fall within the scope of the present disclosure.

What is claimed is:

1. A display device comprising:
a substrate;
a plurality of pixels on the substrate, each of the pixels comprising first to third sub-pixels each comprising at least one light emitting diode configured to emit light;
a color conversion layer comprising first to third color conversion patterns respectively corresponding to the first to third sub-pixels, each of the first to third color conversion patterns being configured to transmit the light or convert the light into light of a different color; and
a plurality of light shielding patterns respectively between adjacent ones of the first to third color conversion patterns,
wherein the plurality of light shielding patterns do not physically contact the substrate,
wherein the light emitting diode of each of the first to third sub-pixels is coupled to a first electrode and a second electrode,
wherein at least one of the first to third color conversion patterns comprises a perovskite compound, and
wherein the perovskite compound is represented by formula 2 below:

$$A_3M_2X_9 \qquad \text{Formula 2}$$

wherein A is selected from the group consisting of monovalent organic cations, monovalent transition metal and alkali metal cations, and combinations thereof, M is selected from the group consisting of trivalent cations and combinations thereof, X is selected from the group consisting of halogen anions and combinations thereof, and two or more of A, M or X are identical or different.

2. The display device according to claim 1, wherein two of the first to third color conversion patterns each comprise a perovskite compound.

3. The display device according to claim 2,
wherein the color conversion patterns each comprising the perovskite compound are the first and second color conversion patterns, and
wherein the first color conversion pattern is configured to convert the light into red light, the second color conversion pattern is configured to convert the light into green light, and the third color conversion pattern is configured to transmit the light.

4. The display device according to claim 3, wherein at least one of the first and second color conversion patterns further comprises a quantum dot.

5. The display device according to claim 3, wherein the light emitting diode is configured to emit blue light.

6. The display device according to claim 1, wherein one of the first to third color conversion patterns comprises a perovskite compound, and another one of the first to third color conversion patterns comprises a quantum dot.

7. The display device according to claim 6, wherein the first color conversion pattern comprises a quantum dot configured to convert the light into red light, and the second color conversion pattern comprises a perovskite compound configured to convert the light into green light.

8. The display device according to claim 7, wherein the second color conversion pattern further comprises a quantum dot.

9. The display device according to claim 7, wherein the light emitting diode is configured to emit blue light.

10. The display device according to claim 1, wherein the perovskite compound has a form selected from the group consisting of a quantum dot, a nanocrystal, a nanoplate, a nanosheet, and combinations thereof.

11. The display device according to claim 1, wherein a composite comprises the perovskite compound and a polymer.

12. The display device according to claim 1, wherein the color conversion pattern is provided by scattering or stacking the perovskite compound in a dielectric matrix.

13. The display device according to claim 1, wherein at least one of the first to third color conversion patterns further comprises a scatterer.

14. The display device according to claim 1, wherein the color conversion layer further comprises first to third color filters respectively on the first to third color conversion patterns.

* * * * *